Aug. 8, 1972 R. O. BOHANNON, JR 3,682,724

PROCESS FOR FABRICATING INTEGRATED CIRCUIT HAVING MATCHED COMPLEMENTARY TRANSISTORS

Original Filed June 30, 1967 3 Sheets-Sheet 1

3,682,724
Patented Aug. 8, 1972

3,682,724

PROCESS FOR FABRICATING INTEGRATED CIRCUIT HAVING MATCHED COMPLEMENTARY TRANSISTORS

Ralph O. Bohannon, Jr., Richardson, Tex., assignor to Texas Instruments Incorporated, Dallas, Tex.

Original application June 30, 1967, Ser. No. 650,502, now Patent No. 3,473,090, dated Oct. 14, 1969. Divided and this application Feb. 5, 1969, Ser. No. 810,435
Int. Cl. H01l 7/36, 19/00
U.S. Cl. 148—175 4 Claims

ABSTRACT OF THE DISCLOSURE

A process for fabricating an integrated circuit having a matched pair of complementary transistors, and different resistors, diodes and capacitors. The starting material is a p-type substrate with an n-type epitaxial layer. First the collector region of the PNP transistor is partially diffused, then p-type isolation rings diffused around both transistors and through the epitaxial layer. Then a third p-type diffusion is made to form the base region of the NPN transistor, a first n-type diffusion is made to form the base region of the PNP transistor, a second n-type deposition is made to form the emitter region of the NPN transistor and base contact of the PNP transistor, and finally a fourth p-type diffusion is made to form the emitter of the PNP transistor and the base contact of the NPN transistor. The product is an integrated circuit wherein each individual component is isolated and the two transistors have substantially the same operational parameters. A separate resistor diffusion is made prior to the emitter diffusion to achieve a high sheet resistance.

The invention described herein was made in the performance of work under a NASA contract and is subject to the provisions of Section 305 of the National Aeronautics and Space Act of 1958, Public Law 85-568 (72 Stat 435; 42USC2457).

This application is a division of application Ser. No. 650,502 filed June 30, 1967, now U.S. Letters Patent No. 3,473,090, issued Oct. 14, 1969.

This invention relates generally to semiconductor devices, and more particularly relates to the fabrication of monolithic silicon circuits having matched complementary PNP and NPN bipolar transistors.

There are many instances when it is desirable to use complementary transistors in integrated circuits. One example is the micropower logic gate described in copending U.S. application Ser. No. 552,358, entitled "High Speed, Low Power Logic Gate," filed on behalf of George W. Niemann on Apr. 18, 1966, now U.S. Pat. 3,365,255, by the assignee of the present invention, which uses a pair of complementary bipolar transistors as the output stage to achieve low standby power. In order to achieve optimum performance, these logic circuits must be in monolithic form with well matched complementary transistors and high value resistors.

In order to fabricate a complete monolithic circuit, it is also necessarfy that the process permit the simultaneous fabrication of resistors, diodes, and capacitors. The normal procedure for fabricating resistors is to utilize the base and emitter regions of the transistors, depending on the values of the resistors required for the circuit. In general, these diffused regions must have relatively low sheet resistance values in order to achieve transistors having optimum performance. In the micropower logic circuits referred to in the above-referenced patent application, very large resistance values are required for optimum operation of the circuit. Since the value of a diffused resistor is a function of the product of the sheet resistance times the length divided by the width of the diffused area, the low sheet resistance and limitations in minimum width of the resistance require an unusually large area to provide the necessary resistance. Also, in this type of circuit the temperature coefficient of the resistors can be used to compensate for the variations in the base-emitter voltage of the transistors with temperature.

A number of processes have been proposed and used which yield integrated circuits having both PNP and NPN transistors on the same substrate. In the most common process, the PNP transistors are formed by utilizing the base and collector of the NPN transistor and the p-type substrate. However, such a procedure results in a trade off of desirable operational parameters between the NPN and the PNP devices. In other processes, separate diffusion steps are used for the two transistors to improve the operational characteristics of the PNP transistor. A number of these processes are described in "Designing a Micro Electronic Differential Amplifier," Electron Products, pages 34–37, July 1962; "Low Power Integrated Circuit," Western Electronics Show and Convention, 1965, Session I; and "Lateral Complementary Transistor Structure for the Simultaneous Fabrication of Functional Blocks," Proceedings of the IEEE, pages 1491–95, December 1964. In general, these processes are complex and for one reason or the other are not satisfactory for producing micropower circuits having closely matched complementary transistors and high resistance values.

In accordance with this invention, an integrated circuit having a matched pair of complementary transistors is provided by a p-type substrate, an n-type epitaxial layer overlying the substrate, a pair of p-type diffused isolation rings extending through the epitaxial layer to the substrate, a PNP transistor formed in the epitaxial layer within one of the isolation rings by three diffused regions, and an NPN transistor formed in the epitaxial layer within the other isolation ring by two diffused regions and the epitaxial layer.

In accordance with another aspect of the invention, the above integrated circuit is fabricated by performing a first p-type deposition and partial diffusion into the n-type epitaxial layer to introduce the impurities for subsequently forming the collector region of the PNP transistor, performing a second p-type deposition and partial diffusion to introduce impurities for forming the isolation rings around both the PNP and NPN transistors, performing a third p-type deposition to form the base region of the NPN transistor, performing a first n-type deposition and partial diffusion to form the base region of the PNP transistor, performing a high concentration relatively low temperature n-type deposition and diffusion to form the base contact of the PNP transistor and the emiter of the NPN transistor, and finally performing a high concentration relatively low temperature p-type deposition and diffusion to form the emitter of the PNP transistor and the base contact of the NPN transistor.

In accordance with a more specific aspect of the invention, resistors having high sheet resistivity are formed in a separate n-type isolated region by performing a separate p-type deposition and diffusion prior to the formation of the emitters of both transistors.

As a result, both NPN and PNP transistors may be formed on the same substrate together with the necessary resistors, diodes and capacitors to form an integrated circuit. The operational parameters of the complementary transistors are very closely matched and are suitable for use in monolithic micropower logic circuits or in monolithic linear circuits. The process also produces resistors having a high sheet resistance to provide micropower operation and a high temperature coefficient which may be used to compensate for changes in the $V_{BE}$ of the transistors with temperature.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figure 1:
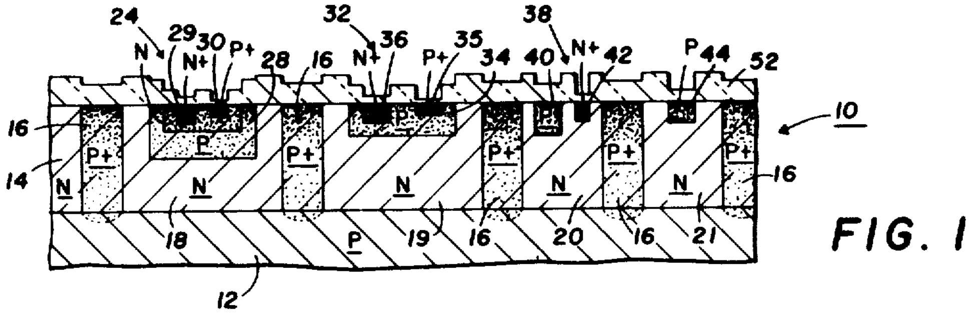
FIG. 1 is a schematic sectional view illustrating a monolithic circuit fabricated in accordance with the present invention.

Referring now to the drawings, a monolithic circuit constructed in accordance with the present invention is indicated generally by the reference numeral 10 in FIG. 1. The integrated circuit 10 is comprised of a p-type silicon substrate 12 and an epitaxially formed n-type layer 14 which extends over the entire surface of the substrate. Heavily doped p-type diffused regions 16 extend through the epitaxial layer 14 to the p-type substrate 12 and form a plurality of isolation rings dividing the n-type epitaxial layer into a plurality of electrically isolated pockets 18, 19, 20, and 21. A PNP transistor, indicated generally by the reference numeral 24, is formed by a p-type diffused collector region 26, an n-type diffused base region 28 having a heavily doped n-type contact 29, and a p-type diffused emitter region 30. The isolated pocket 19 of the n-type epitaxial layer 14 forms the collector region of an NPN transistor indicated generally by the reference numeral 32, a p-type diffused region 34 forms the base, and an n-type diffused region 36 forms the emitter. A heavily doped p-type region 35 forms a base contact. A diode, indicated generally by the reference numeral 38, is formed by the isolated pocket 20 of the n-type epitaxial layer 14 and a p-type diffused region 40. Heavily doped n-type diffused region 42 provides ohmic contact with the n-type region 20. A resistor 44 is formed by a p-type diffusion in the isolated pocket 21 of the n-type epitaxial layer 14. In FIG. 1, the oxide layer used as a diffusion mask during the fabrication of the circuit is indicated generally by the reference numeral 52 and is illustrated generally as it exists prior to the time that the openings are cut in the oxide and the metallized film deposited and patterned to form the contacts to the various components.

The monolithic circuit 10 is fabricated in accordance with the present invention by the process illustrated in FIGS. 2–7. The starting material is a p-type silicon substrate 12 having a resistivity of 10–15 ohm-centimeters. An epitaxially grown layer of silicon 14 about eighteen microns thick extends over the entire surface of the substrate 12 and has a resistivity of about 0.2 ohm-centimeter.

All diffusion steps presently to be described employ conventional diffusion techniques in that silicon dioxide is used as a diffusion mask and is patterned using conventional photolithographic techniques. Silicon dioxides for each succeding diffusion step is grown during the preceding diffusion step. Accordingly, the masking process associated with each step will not be described in detail.

Figure 2:
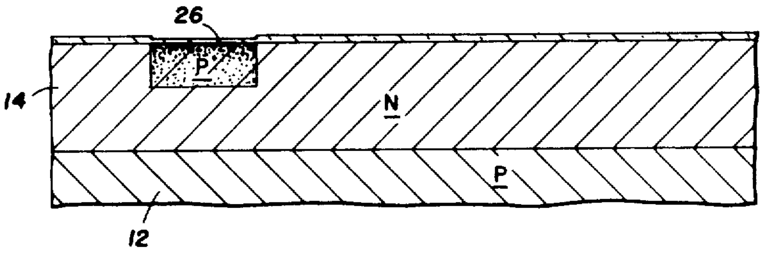
FIGS. 2–7 are schematic cross sections similar to FIG. 1 illustrating the successive steps of the process of the present invention for fabricating the monolithic circuit of FIG. 1.

The first step in the process is the deposition and partial diffusion of the impurities which will ultimately form the p-type collector region 26 of the PNP transistor. This diffusion is typically a standard boron diffusion using boron tribromide ($BBr_3$) as the impurity source. The deposition step is carried out at 950° C. and includes a five minute prepurge, a fifteen minute deposition period, and a five minute after-purge. The resulting sheet resistance is about sixty ohms per square. At this point, the impurities which will ultimately form diffused region 26 have been introduced to the n-type layer 14. The substrate is then subjected to a 10% buffered etch deglaze step and placed in a diffusion furnace having a steam atmosphere and heated to about 1200° C. for about forty minutes, and to about 1250° C. for about thirty minutes, to partially diffuse impurities. The substrate then appears somewhat as represented in FIG. 2.

Figure 3:
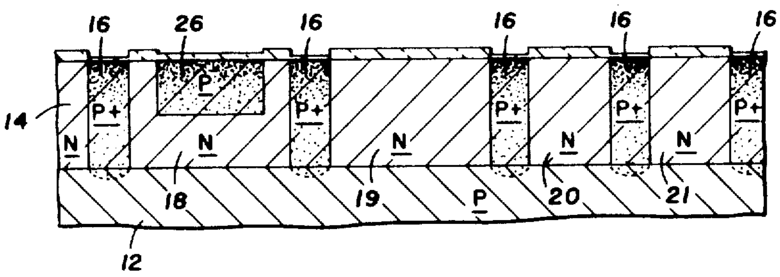

Next, a p-type deposition is made in the areas necessary to form the isolation rings 16 around each of the circuit components. The diffusion step is identical to that just described in connection with area 26, except that the deposition is made at 1150° C. for thirty minutes and the diffusion step is carried out at 1250° C. for about six hours in a dry oxygen atmosphere rather than steam. The substrate then appears somewhat as represented in FIG. 3. It will be noted that the p-type collector region 26 has been diffused to a greater depth than in FIG. 2. In actually, neither of the p-type diffused regions is at its final depth at this stage of the process, but both regions are approaching the final depths which are shown to simplify the illustration.

Figure 4:
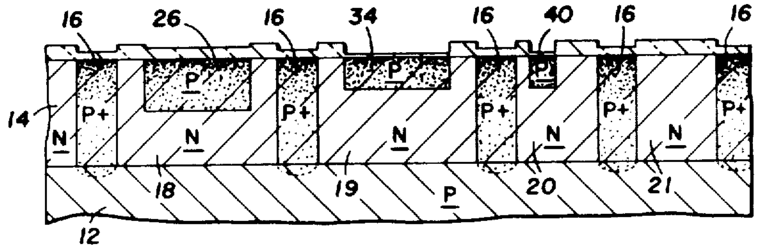

Since the NPN transistor 32 is deeper than the PNP transistor, the p-type base region 34 and the p-type anode region 40 of diode 38 are diffused next. This is again a boron diffusion which may be performed from boron tribromide ($BBr_3$). The deposition is made at 950° C. for a period of fifteen minutes and results in an initial sheet resistance of about sixty ohms per square. After a deglaze step, the substrate is then placed in a diffusion furnace and heated to 1200° C. in an oxygen atmosphere for five minutes, a steam atmosphere for twenty minutes, and a nitrogen atmosphere for five minutes. The resulting structure is represented in FIG. 4.

Figure 5:
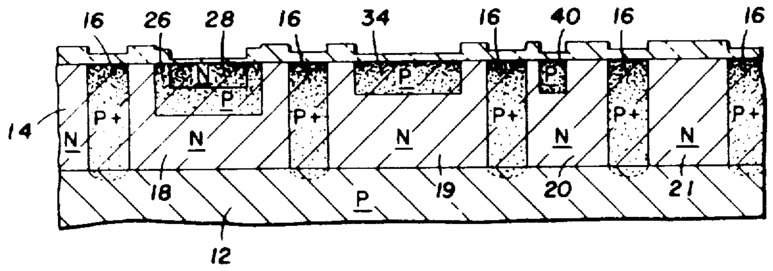
Figure 6:
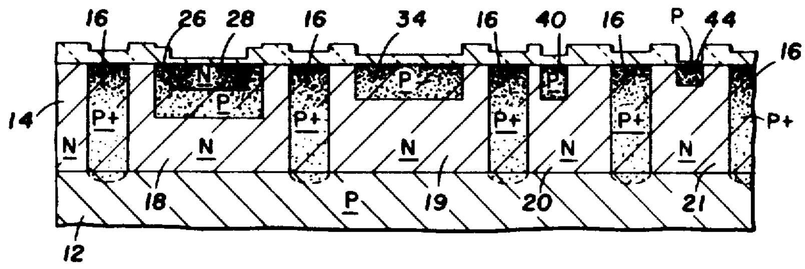
Figure 7:
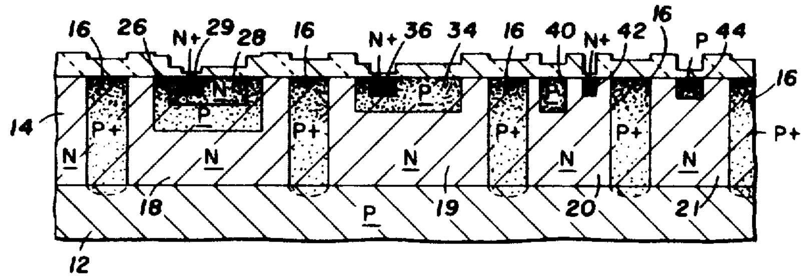

Next, the base region 28 of the PNP transistor is diffused. Phosphorus oxytrichloride ($POCl_3$) may be used to supply phosphorus for doping the silicon. The deposition is made at 800° C. for about twenty minutes, preceded and followed by five minute nitrogen purges, to give a sheet resistance of about 200 ohms per square. After a deglaze step, the base region 28 is diffused at 1200° C. for five minutes in an oxygen atmosphere, twenty minutes in a steam atmosphere, and five minutes in a nitrogen atmosphere. The resulting structure is then approximately as illustrated in FIG. 5.

Next, the resistor 44 is diffused. Again boron tribromide ($BBr_3$) is used to provide boron as the p-type doping impurity. The deposition is made at 850° C. for fifteen minutes preceded and followed by five minute nitrogen purge cycles. The sheet resistance is about 200 ohms per square. After a deglaze step, the substrate is placed in a diffusion furnace and heated to 1200° C. for about twenty minutes in a steam atmosphere, preceded and followed by five minute oxygen and nitrogen cycles. The sheet resistance of the diffused resistor is then about 600 ohms per square.

At this point, the diffusions are substantially at their final depths and final sheet resistances because the two subsequent emitter diffusions are at relatively low temperatures for relatively short periods of time, as will presently be described. The PNP transistor collector region 26 has a sheet resistance of about 150 ohms per square and a depth of about forty lines; the PNP transistor base region 28 has a sheet resistance of about 60 ohms per square and a depth of about five lines; the NPN transistor base region 34 has a sheet resistance of about 175 ohms per square, and a depth of about twelve lines; and the resistor diffusion 44 has a sheet resistance of about 500 ohms per square and a depth of about five lines.

Finally, the NPN transistor region 36, the base contact region 29 and the cathode contact region 42 of the diode 38 are deposited and diffused from phosphorus oxytrichloride ($POCl_3$) at 1100° C. for twenty minutes, preceded and followed by a nitrogen purge. Then after a deglazing step, the PNP transistor emitter region 30 and the NPN transistor base contact region 35 are diffused using boron tribromide as the source of boron. The deposition and diffusion is carried out at 1100° C. for about seven minutes, preceded and followed by one minute nitrogen purges.

In typical monolithic circuits fabricated by the above-described process, the PNP transistors had $h_{FE}$ values of from about eighty to about one hundred and the NPN transistors $h_{FE}$ values of from about sixty to about eighty. Some problems have been experienced in the degrading of the $h_{FE}$ values of the PNP transistors, and to a lesser extent the $h_{FE}$ values of the NPN transistors. These effects can be severe at low current levels which are necessary for micropower operation. This degradation is believed due primarily to unknown surface effects, and can be largely overcome either by an air bake at about 450° C. with aluminum leads in place, or by depositing an oxide layer by the thermal decomposition of tetraethyl orthosilane which is doped with phosphorus. The latter procedure is particularly significant if it is desired to use an aluminum-molybdenum-gold lead system.

Figure 8:
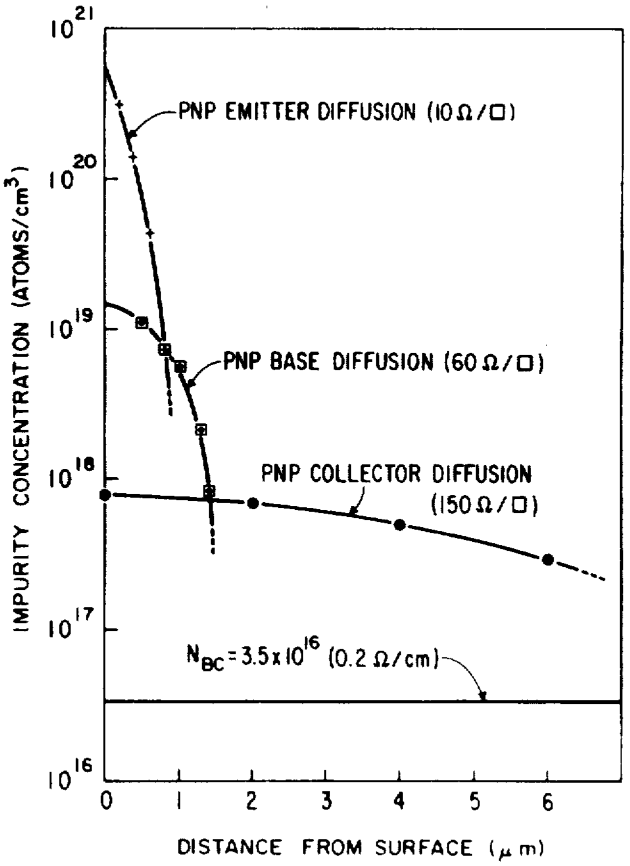
FIG. 8 is a diagram of the impurity profile of the PNP transistor of the monolithic circuit of FIG. 1.
Figure 9:
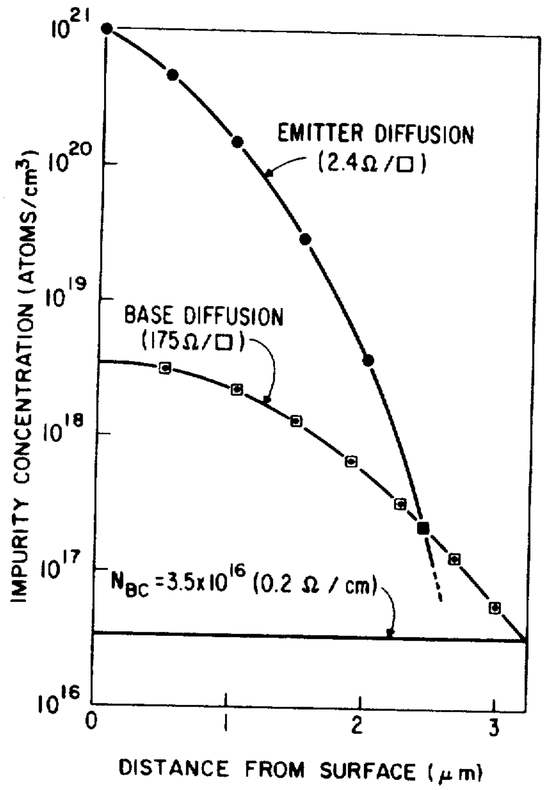
FIG. 9 is a diagram of the impurity profile of the NPN transistor of the monolithic circuit of FIG. 1.
Figure 10:
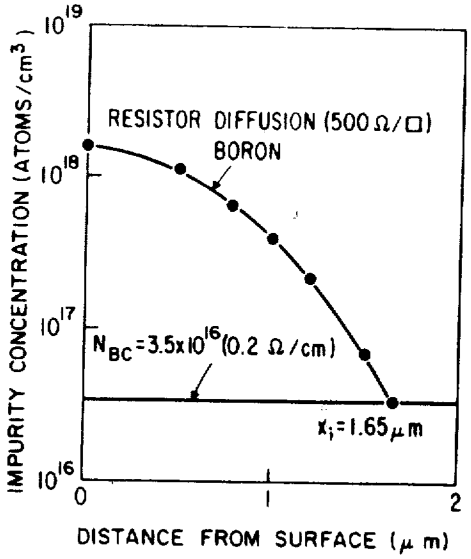
FIG. 10 is an impurity profile of the diffused resistor of the monolithic circuit of FIG. 1.
Figure 11:
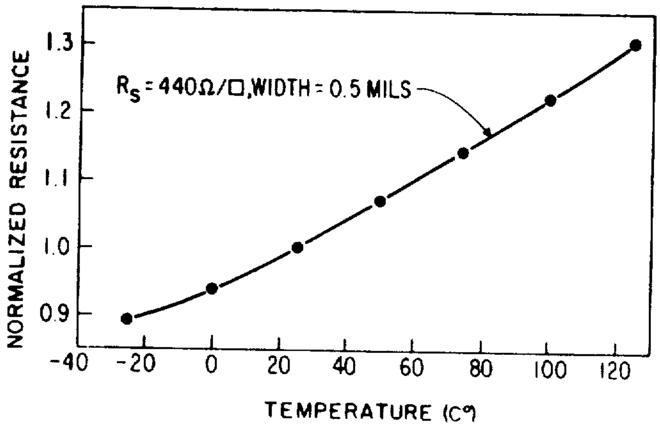
FIG. 11 is a plot of the temperature coefficient of the diffused resistor of the monolithic circuit of FIG. 1.

FIGS. 8, 9, and 10 show the impurity profiles of the PNP transistor, the NPN transistor, and the resistor 44, respectively. The sheet resistance per square of each of the diffused regions is also illustrated. FIG. 11 is a plot of the normalized resistance with respect to temperature of a resistor having a width of 0.5 mil and a sheet resistance of about 400 ohms per square. It will be noted that the relatively high sheet resistance of the resistor diffusion is accompanied by a relatively high temperature coefficient. As a result, substantial temperature compensation for changes in the base-emitter voltage of the transistors is provided by the resistors when used in logic gate circuits of the type described in the above-referenced copending application.

Although preferred embodiments of the invention have been described in detail, it is to be understood that various changes, substitutions and alterations can be made therein without departing from the spirit and scope of the invention as defined by the appended claims.

What is claimed is:

1. A method of making a monolithic integrated circuit including a matched pair of complementary bipolar transistors, essentially comprising the following steps:

(a) epitaxially depositing a thin layer of semiconductor material of one conductivity type over substantially the entire area of one surface of a semiconductor substrate of opposite conductivity type, said epitaxial layer having an impurity concentration on the order of $3.5\times10^{16}$ atoms/cc. and a depth of about 18 microns and said substrate having a resistivity of 10–15 ohm-centimeters;

(b) diffusing a first region of said other conductivity type in said epitaxial layer, said first region being doped with boron and having an impurity concentration at the surface on the order of $8\times10^{17}$ atoms/cc. and a depth of about 10 microns;

(c) diffusing a plurality of isolation rings of said other conductivity type through said epitaxial layer to said substrate so as to form a plurality of electrically isolated pockets, with said first region being positioned within a first one of said pockets;

(d) diffusing a second region of said other conductivity type in a second one of said pockets, said second region being doped with boron and having an impurity concentration at the surface on the order of $5\times10^{18}$ atoms/cc. and a depth of about 2.5 microns;

(e) diffusing a third region of said one conductivity type in said first region, said third region being doped with phosphorous and having an impurity concentration at the surface on the order of $1.5\times10^{19}$ atoms/cc. and a depth of about 1.3 microns;

(f) concurrently diffusing fourth and fifth regions of said one conductivity type respectively in said second and third regions, said fourth and fifth regions being doped with phosphorous and having an impurity concentration at the surface on the order of $1\times10^{21}$ atoms/cc. and a depth of about 2.5 microns; and (g) concurrently diffusing sixth and seventh regions of said other conductivity type respectively in said second and third regions respectively spaced from said fourth and fifth regions, said sixth and seventh regions being doped with boron and having an impurity concentration at the surface on the order of $7\times10^{20}$ atoms/cc. and a depth of about 0.8 microns; wherein (h) said first, third, fourth and sixth regions are respectively the collector, base, base contact and emitter regions of one of said pair of complementary transistors; and wherein (i) said second, fifth and seventh regions are respectively the base, emitter and base contact regions of the other one of said pair of complementary transistors, whereby the portion of said epitaxial layer within said second pocket is the collector region of said other complementary transistor.

2. The method of claim 1 wherein said one conductivity is N-type, said opposite conductivity is P-type, and said first and second transistors are PNP and NPN transistors, respectively.

3. The method of claim 2 and further including the forming of an electrically isolated diffused diode, essentially comprising the following steps:

(a) diffusing an eighth region of said opposite conductivity type within a third one of said pockets concurrently with the diffusion step of said second region said eighth region being doped with boron and having an impurity concentration at the surface on the order of $5\times10^{18}$ atoms/cc. and a depth of about 2.5 microns; and (b) diffusing a ninth region of said one conductivity type within said third pocket spaced from said eighth region concurrently with the diffusion step of said fourth and fifth regions said ninth region being doped with phosphorous and being an impurity concentration at the surface on the order of $1\times10^{21}$ atoms/cc. and a depth of about 1.3 microns; wherein (c) said eighth and ninth regions are respectively the anode and cathode contact regions of said diode, whereby the portion of said epitaxial layer within said third pocket is the cathode region of said diode.

4. The method of claim 3 and further including the forming of an electrically isolated diffused resistor essentially comprising the step of diffusing a tenth region of said opposite conductivity type within a fourth one of said pockets intermediate the diffusion steps of said third region and of said fourth and fifth regions said tenth region being doped with boron and having an impurity concentration at the surface on the order of $1.0 \times 10^{18}$ atoms/cc. and a depth of about 1.65 microns.

References Cited

UNITED STATES PATENTS

| | | | |
|---|---|---|---|
| 3,260,902 | 7/1966 | Porter | 317—235 |
| 3,370,995 | 2/1968 | Lowery et al. | 148—175 |
| 3,380,153 | 4/1968 | Husher et al. | 29—577 |
| 3,387,193 | 6/1968 | Donald | 317—235 |
| 3,404,321 | 10/1968 | Kurosawa et al. | 317—235 |
| 3,423,653 | 1/1969 | Chang | 317—235 |
| 3,436,282 | 4/1969 | Shoda | 148—187 |
| 3,460,006 | 8/1969 | Strull | 148—175 X |
| 3,481,801 | 12/1969 | Hugle | 148—175 |

OTHER REFERENCES

Warner, R. M., et al. "Integrated Circuits, Design Principles and Fabrication," McGraw-Hill Book Co., 1965, pp. 145–150 and 246–264.

L. DEWAYNE RUTLEDGE, Primary Examiner

W. G. SABA, Assistant Examiner

U.S. Cl. X.R.

29—577; 117—201, 212; 148—187, 188; 317—235 R